United States Patent
Bosschaerts et al.

[11] Patent Number: 5,804,355
[45] Date of Patent: Sep. 8, 1998

[54] PRODUCING A CONTONE IMAGE BY SEQUENTIALLY EXPOSING A THERMO-SENSITIVE IMAGING MATERIAL BY MEANS OF A SET OF RADIATION BEAMS

[75] Inventors: Jacobus Herman Bosschaerts; Robert Theodoor Overmeer, both of Mortsel; Leo Oelbrandt, Kruibeke; Hans Louis Strijckers, Oudergem; Eddie Roza Daems, Herentals, all of Belgium

[73] Assignee: Agfa-Gevaert N.V., Mortsel, Belgium

[21] Appl. No.: 812,450

[22] Filed: Mar. 6, 1997

Related U.S. Application Data

[60] Provisional application No. 60/015,678 Apr. 17, 1996.

[30] Foreign Application Priority Data

Mar. 14, 1996 [EP] European Pat. Off. .............. 96200689

[51] Int. Cl.$^6$ .............................. G03C 1/498; G03C 5/04; G03C 5/26
[52] U.S. Cl. .......................... 430/346; 430/200; 430/201; 430/349; 430/394; 430/353; 430/945
[58] Field of Search .................................... 430/346, 349, 430/353, 394, 333, 336, 200, 201, 945; 358/480

[56] References Cited

U.S. PATENT DOCUMENTS

| | | | |
|---|---|---|---|
| 4,383,261 | 5/1983 | Goldberg | 430/346 |
| 5,429,908 | 7/1995 | Hokus et al. | 430/394 |
| 5,627,007 | 5/1997 | Van den Bergh et al. | 430/394 |

*Primary Examiner*—Richard L. Schilling
*Attorney, Agent, or Firm*—Baker & Botts, L.L.P.

[57] ABSTRACT

Thermal recording or producing of a contone image comprises an imagewise and scanwise exposing a thermographic recording material with a set (s) of radiation beams (b), wherein at any given moment (t) during the exposure at least two radiation beams impinge on different dots (m) of a scanline (l), so that by completion of the exposure each effective dot of the scanline has been impinged. Photo-thermographic recording or producing comprises a developing of the exposed photo-thermographic recording material with a set (s) of radiation beams (b), wherein at any given moment (t) during the development at least two radiation beams impinge on different dots (m) of a scanline (l), so that by completion of the development step each dot of the scanline has been impinged by all radiation beams.

10 Claims, 8 Drawing Sheets

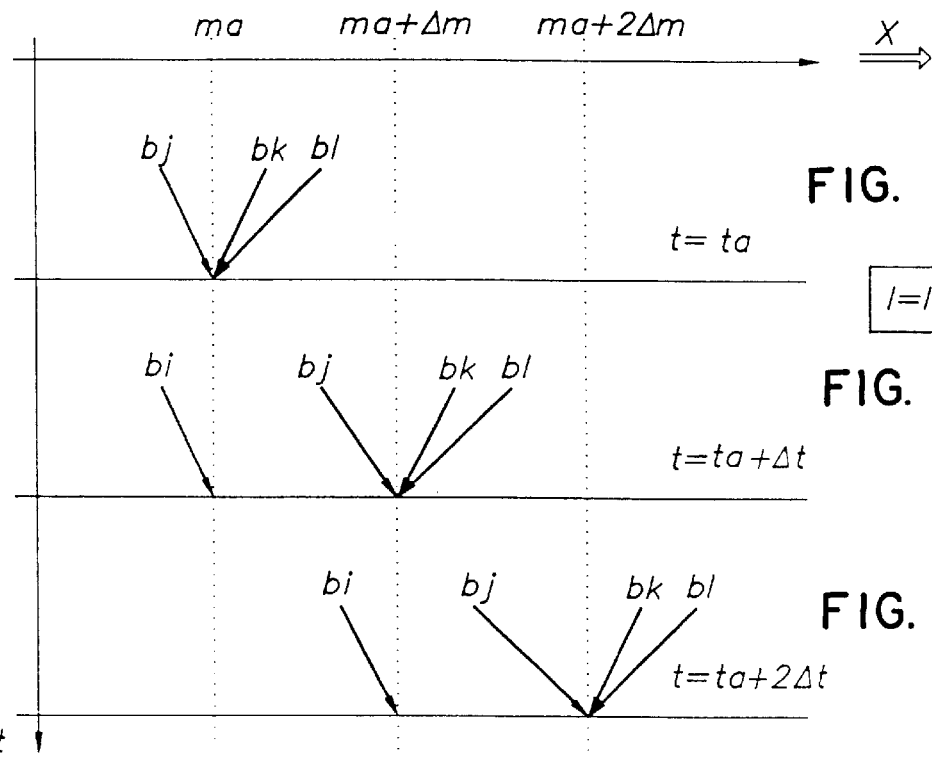
FIG. 5A
FIG. 5B
FIG. 5C
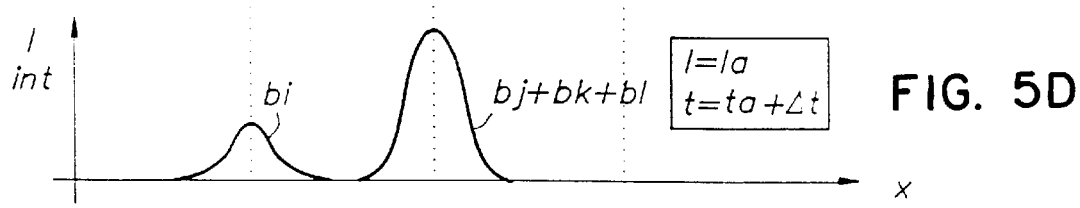
FIG. 5D
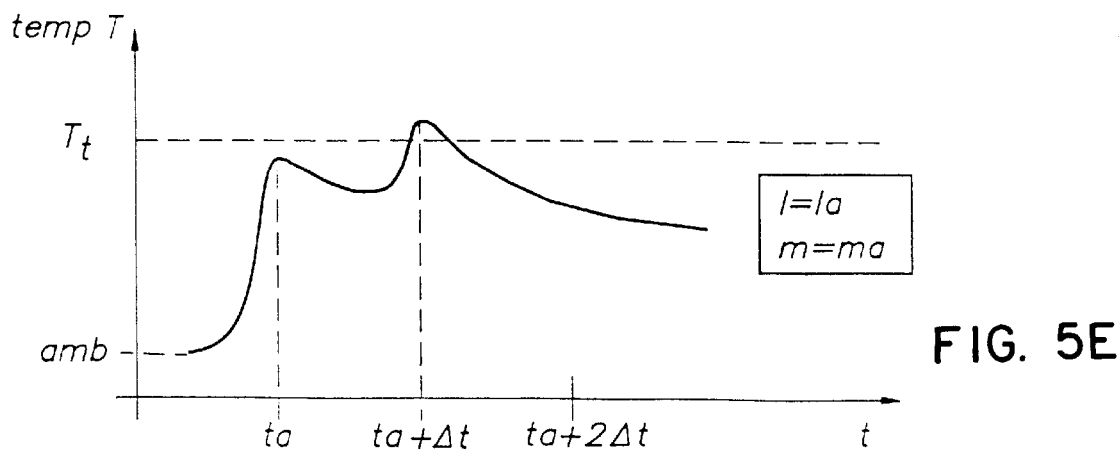
FIG. 5E

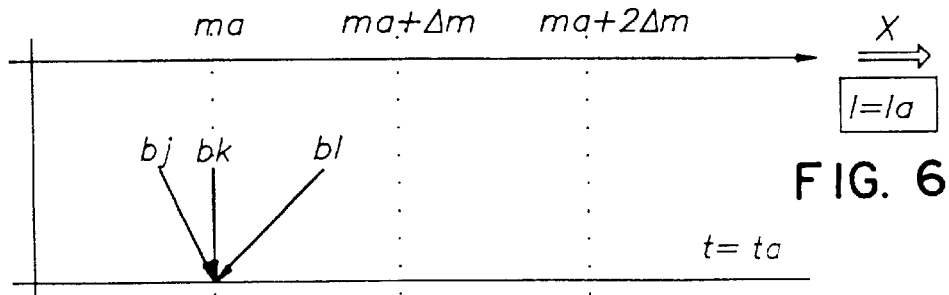
FIG. 6A
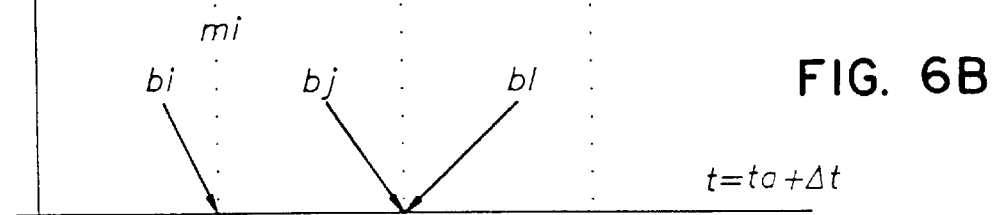
FIG. 6B
FIG. 6C
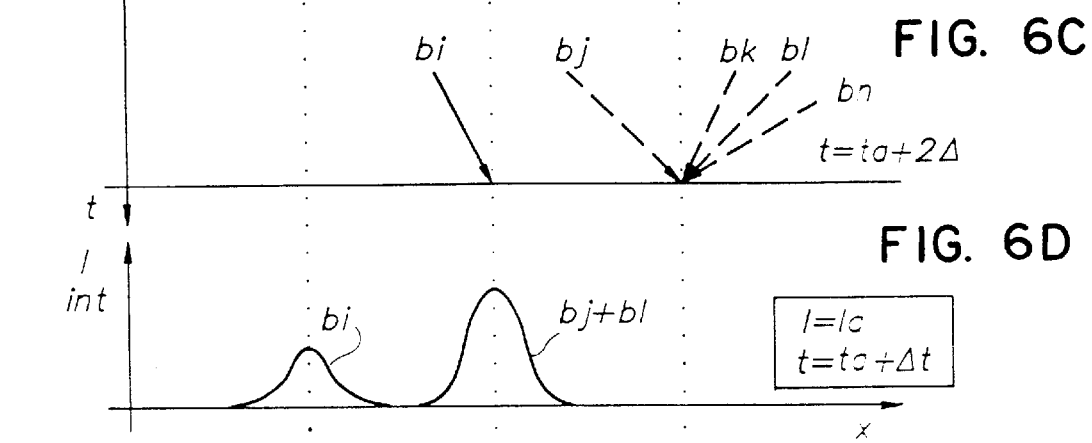
FIG. 6D
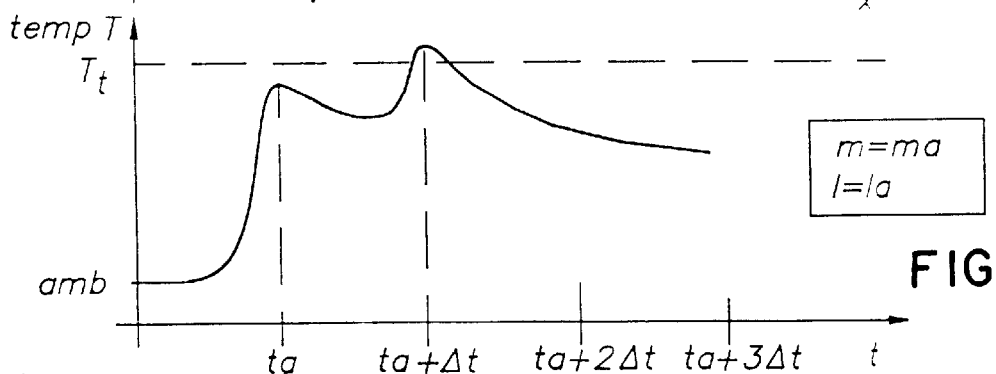
FIG. 6E
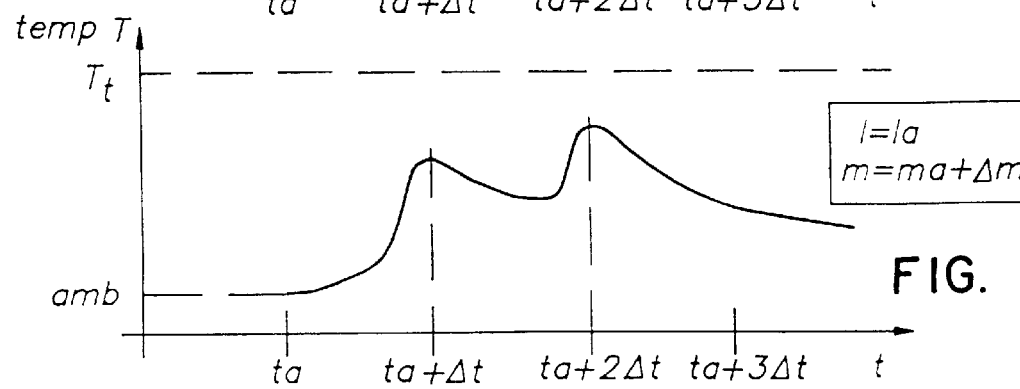
FIG. 6F

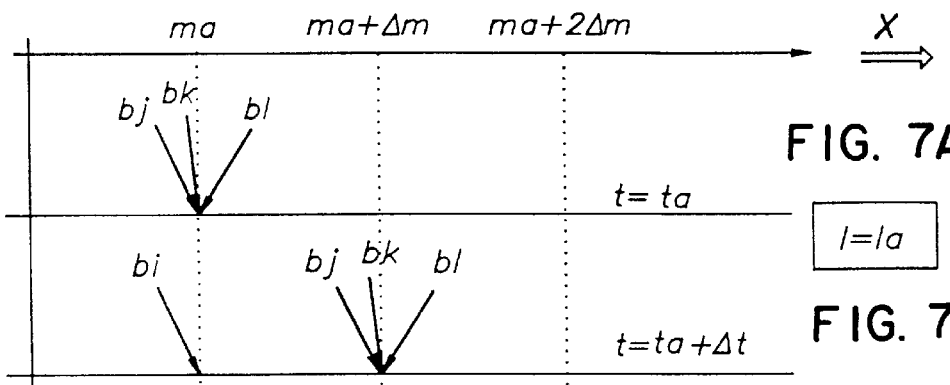
FIG. 7A
FIG. 7B
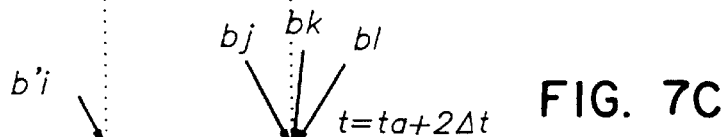
FIG. 7C
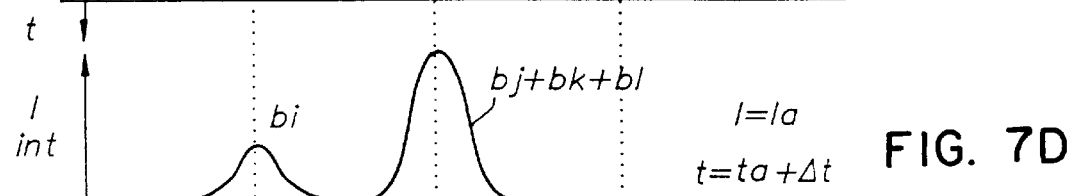
FIG. 7D
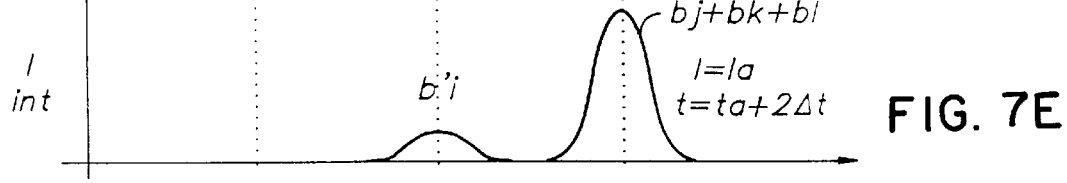
FIG. 7E
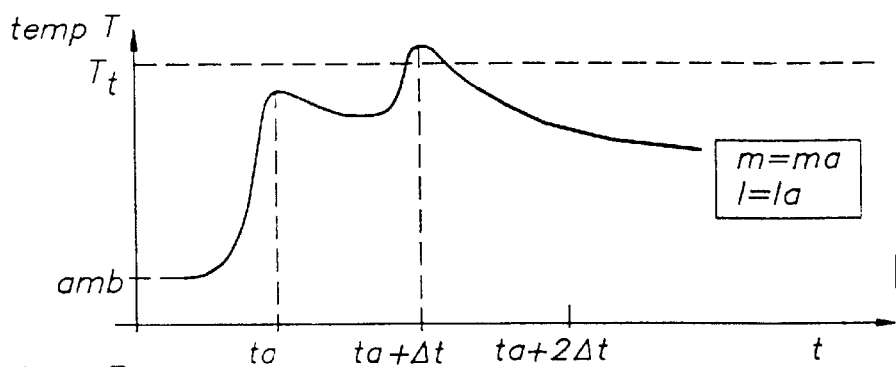
FIG. 7F
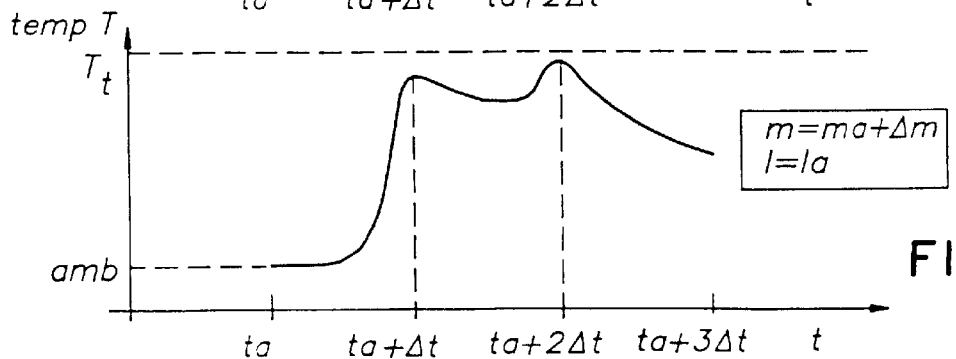
FIG. 7G

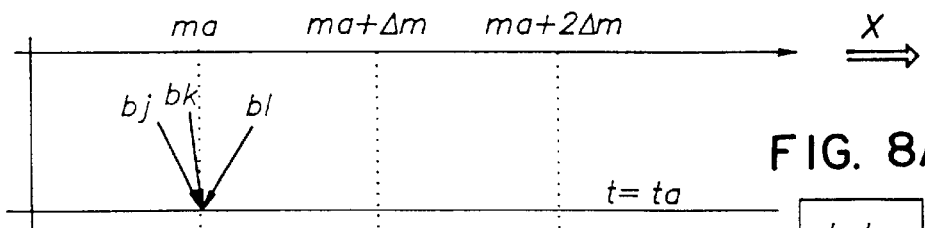
FIG. 8A
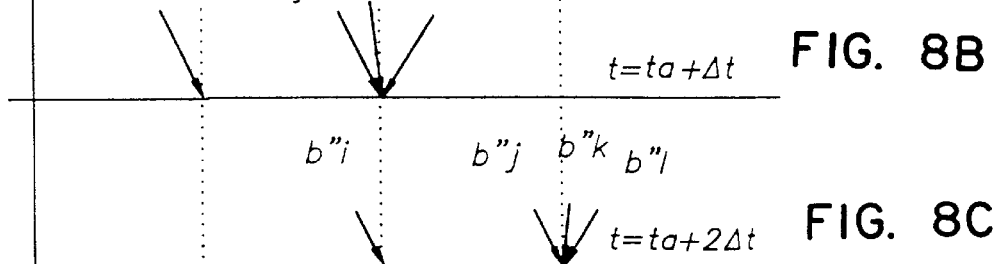
FIG. 8B
FIG. 8C
FIG. 8D
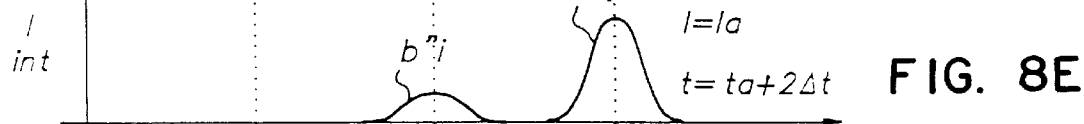
FIG. 8E
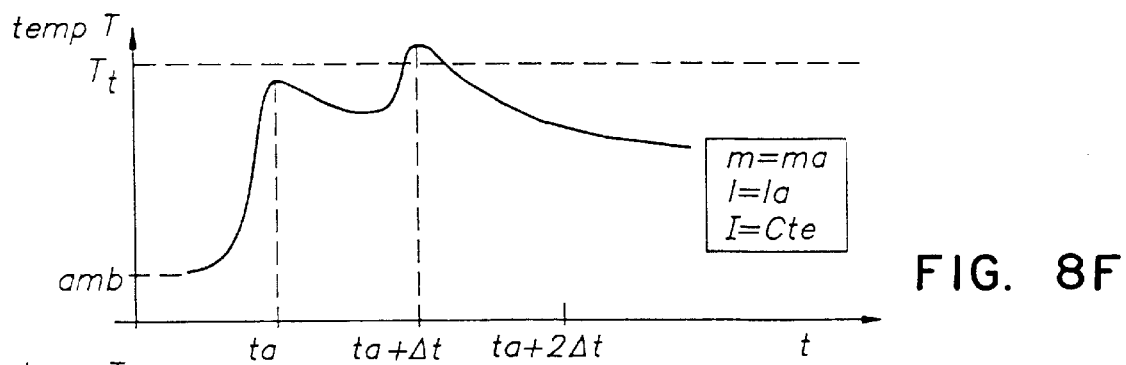
FIG. 8F
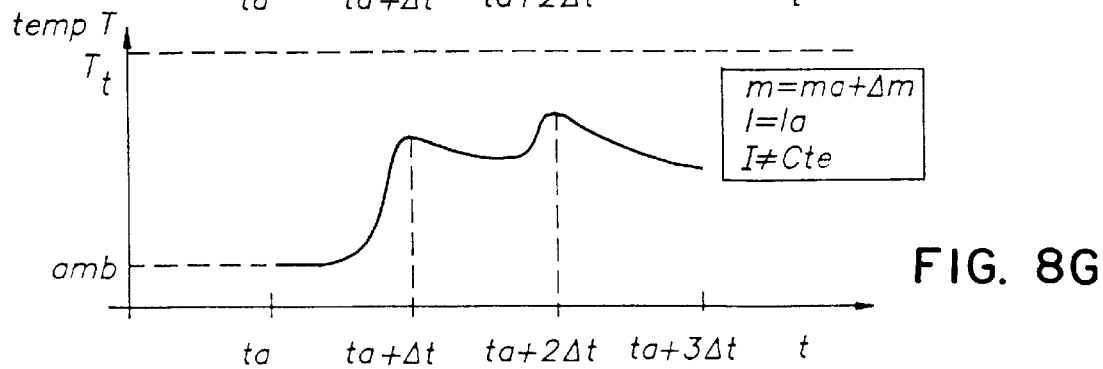
FIG. 8G

PRODUCING A CONTONE IMAGE BY SEQUENTIALLY EXPOSING A THERMO-SENSITIVE IMAGING MATERIAL BY MEANS OF A SET OF RADIATION BEAMS

The application claims the benefit of the U.S. Provisional Application No. 60/015,678, filed Apr. 17, 1996.

FIELD OF THE INVENTION

The present invention relates to a recording method for thermographic and for photo-thermographic imaging. More particularly, the invention relates to a method for recording a contone image by sequentially exposing or developing a thermosensitive recording material by means of a set or plurality of radiation beams.

BACKGROUND OF THE INVENTION

Thermal imaging or "thermography" is a recording process wherein images are generated by the use of imagewise modulated thermal energy. Thermography is concerned with materials which are sensitive to heat and wherein imagewise applied heat brings about a visible change in a thermosensitive recording material, by a chemical or a physical process which changes the optical density.

One thermography-approach, called "direct thermography", comprises direct thermal formation of a visible image pattern by imagewise heating of a recording material containing matter that by chemical or physical process changes colour or optical density. In direct thermography, most recording materials are of the chemical type. On heating to a certain conversion temperature, an irreversible chemical reaction takes place and a coloured image is produced.

In one type of direct thermal printing, said heating of the recording material may originate from image signals which are converted to electric pulses and then through a driver circuit selectively transferred to a thermal printhead. The thermal head consists of microscopic heat resistor elements, which convert the electrical energy into heat via the Joule effect. The electric pulses thus converted into thermal signals manifest themselves as heat transferred to the surface of the thermosensitive recording material wherein the chemical reaction resulting in colour development takes place. This principle is described in "Handbook of Imaging Materials" (edited by A. Diamond, published Marcel Dekker Inc., New York, ed 1991, p. 498–499).

In another type of direct thermal printing, said heating of the recording material may originate from image signals which are converted to exposure pulses of radiation beams impinging on the thermo-sensitive recording material. A particular interesting direct thermal imaging element or recording material uses an organic silver salt in combination with a reducing agent and an infra-red absorber. An image, e.g. a black and white image, can be obtained with such a material because under the influence of heat the silver ions are developed to metallic silver.

Another thermography-approach, called "photo-thermography", comprises (i) formation of a latent image pattern by imagewise exposing a recording material comprising a photosensitive agent which after exposure to ultraviolet-UV, visible or infrared-IR light is capable of catalysing or participating in a thermographic process; (ii) development of said exposed photo-thermographic recording material by uniformly heating the exposed recording material to a desired development temperature, thus creating a visible image.

Examples of photo-thermographic materials are the so called "Dry Silver" photographic materials of the 3M Company, which are reviewed by D. A. Morgan in "Handbook of Imaging Science" (edited by A. Diamond, published by Marcel Dekker Inc., New York, ed. 1991, page 43).

Such thermographic imaging elements and such photo-thermographic imaging elements substantially have rather continuous (or "soft") characteristics, meaning that changes of input energies result in corresponding changes in output densities (cfr. FIGS. 9 and 10, to be explained in the next paragraph). Therefor, in opposite to so-called "binary devices" mainly intended for the production of text and line-art (cfr. offset printing presses), in the present application no halftoning or screening techniques is necessary. (More information about such halftoning or screening techniques used in binary devices can be found in co-pending application Ser. No. 08/812,448, entitled "Producing a lithographic plate by sequentially exposing a thermo-sensitive imaging element by means of a set of radiation beams", filed on a same date).

In order to support the rather soft sensitometry of the captioned imaging elements, reference is made now to FIGS. 9 and 10. FIG. 9 illustrates a density curve (achieved with conventional thermal heads) of two thermographic recording materials according to the prior art and is reproduced from "3M's Dry Silver Technology, An Ideal Medium for electronic Imaging", D. Morgan, in The Journal of Photographic Science, Vol. 41, 1993, pp. 108–109. Herein, curve 21 represents characteristics of a direct thermal film of 3M™ "based on dry silver chemistry but with significant modifications" (cit. p. 109, col. 3), illustrated with a Dmax of 2.89 and a Dmin of 0.04. Curve 22 represents a competitive thermographic recording material with a Dmax<1 and a Dmin of 0.05. It may be clear that each of said curves 21 and 22 can refer to a different application of thermal producing a contone image.

FIG. 10 illustrates a typical DlogE-curve 31 or sensitometry of a Dry silver colour material (according to 3M) and is reproduced from "New Capabilities with Dry Silver recording Materials", D. Morgan, in Journal of Imaging Technology, Vol. 13, Number 1, February 1987, pp. 4–7. According to said publication, the material was processed at 270° F. (or 132° C.) for 10 seconds, and shows a Dmax= 1.70, a Dmin=0.20, a gamma of 2.0, a sensitivity-speed of 50 erg/cm$^2$ (at 0.6 D). Curve 31 further indicates a good tone scale capability.

However, during the exposure with radiation beams of such thermographic or photo-thermographic imaging elements or recording materials sometimes unwanted side-effects may occur, which result in a deterioration of the resulting image-quality.

These unwanted phenomena especially occur at a higher recording (or scanning) speed, or at a lower "recording time per dot", further abbreviated as $t_p$. Because of economical reasons, as a higher throughput means a higher productivity, there is a strong interest in industry to increase the recording speeds. Now, for a given thermo-sensitive recording material, like those indicated in the previous paragraphs, unwanted side-reactions will occur when a given recording speed limit is surpassed. Due to the fact that a higher speed inherently requires a higher recording power (because only a smaller recording time per dot is available for putting in a same energy), the required power when increasing the recording speed will become too high at a given speed for the recording material to accommodate properly the heat or temperature build-up that goes with it. (More information on said problems, particularly in direct thermal printing by means of a thermal printhead, can be found e.g. in EP-0 622 217 or in EP 0 654 355, both in the name of Agfa-Gevaert N.V.)

In case of direct thermography and of photo-thermography, especially at higher recording powers (e.g. at higher recording speeds), it appears to be difficult to obtain a neutral black tone image and a desired number of grey levels. Such may be required for many applications, in particular if the image is to be used for medical diagnostic purposes.

In other applications, at higher recording powers (e.g. at higher recording speeds) possibly also another unwanted side-reaction takes place (such as inadequate development or density), which may cause a lowered "image quality".

It would be appropriate to have a hardware solution for this problem.

OBJECTS OF THE INVENTION

Accordingly it is an object of the present invention to provide an improved recording method for making a contone image using a thermo-sensitive recording material, that is imagewise heated by means of radiation beams, which method yields an improved quality in the printed images.

More particularly, it is an object of the present invention to accept increased recording speeds, without the occurrence of any unwanted side-reactions that impact the image quality of the printed images.

Further objects and advantages will become apparent from the description given below.

SUMMARY OF THE INVENTION

We first have found that the above mentioned objects can be achieved by providing a method for direct thermal producing (also-called "direct thermal recording") a contone image, comprising the step of imagewise and scanwise exposing a thermographic recording material with a set (s) of radiation beams (b), characterised in that at any given moment (t) during said exposure at least two radiation beams of said set (s) of radiation beams impinge on different dots (m) of a scanline (l) on said thermographic recording material, so that by completion of the exposure step each effective dot (meaning a dot corresponding to a density different to zero) of said scanline had been impinged by all effective radiation beams (which are radiation beams corresponding to an effective change in density on said thermographic recording material) of said set.

We also have found that the above mentioned objects can be achieved by providing a method for photo-thermographic producing a contone image, comprising the steps of: (1) imagewise exposing said photo-thermographic recording material; (2) developing said exposed photo-thermographic recording material with a set (s) of radiation beams (b), characterised in that at any given moment (t) during said development at least two radiation beams of said set (s) of radiation beams impinge on different dots (m) of a scanline (l) on said photo-thermographic recording material, so that by completion of the development step each dot of said scanline has been impinged by all effective radiation beams of said set.

It has to be remarked that the contone image does not need to be screened (or "half-toned").

BRIEF DESCRIPTION OF THE DRAWINGS

The invention will be described with reference to the accompanying drawings, without the intention to limit the invention hereto, in which:

FIGS. 5A to 5E, 6A to 6F, 7A to 7G, and 8A to 8G illustrate for some neighbouring dots on a same scanline the consecutive impingement of a set of radiation beams according to the present invention, corresponding intensity or energy distribution curves, and corresponding temperature evolutions in the thermo-sensitive recording material.

DETAILED DESCRIPTION OF THE INVENTION

Figure 1:
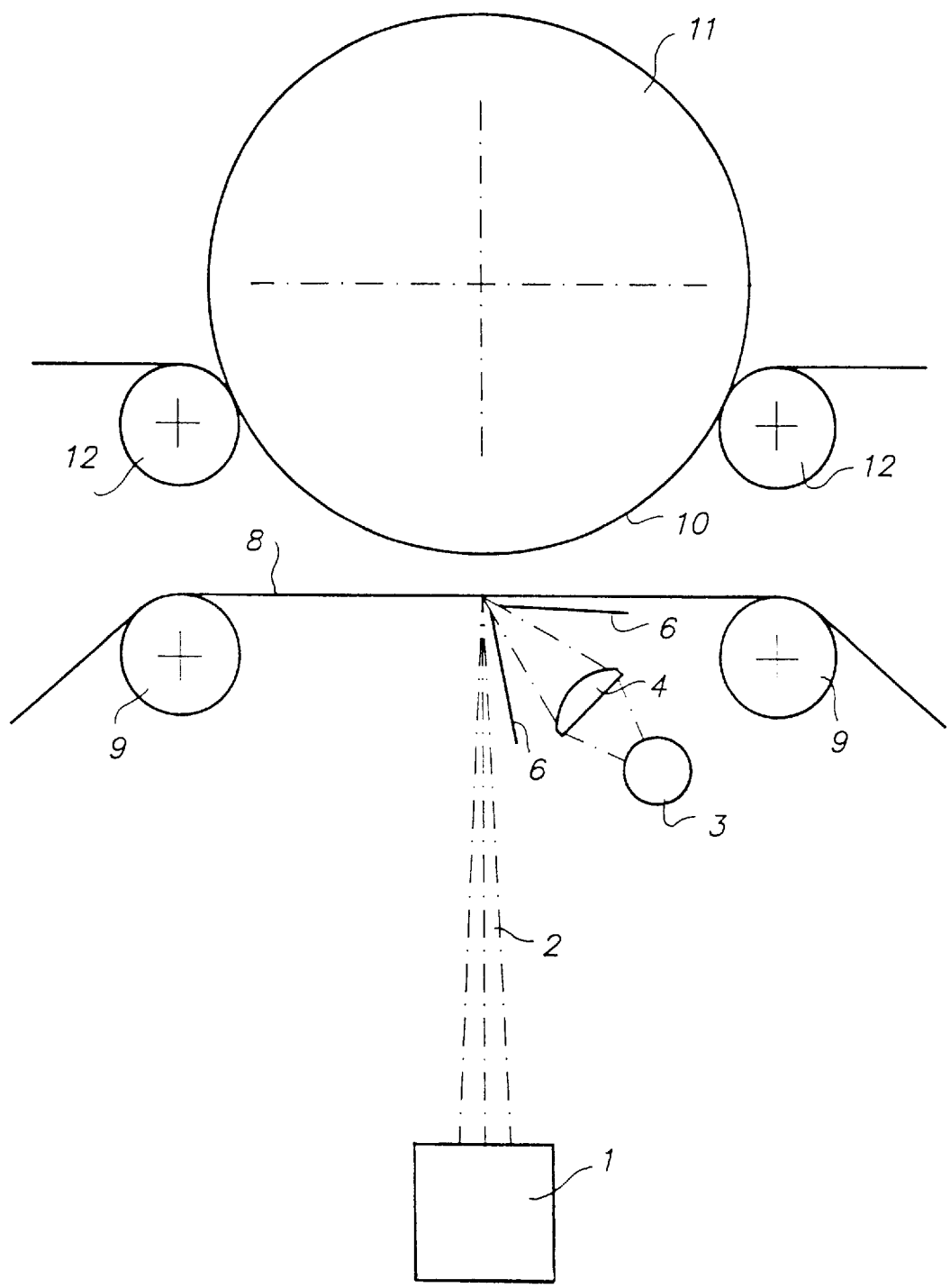
FIG. 1 is a schematic cross-sectional view of a laser-induced-dye-transfer system usable in a method according to the present invention.

The description given hereinafter mainly comprises four chapters, namely (i) terms and definitions used in the present application, (ii) preferred embodiments of methods for thermal recording (or producing) a contone image according to the present invention, (iii) preferred embodiments for thermo-sensitive recording materials suitable for use in a method according to the present invention, (iv) further applications of the present invention.

(i) Explanation of Terms Used in the Present Description

As an aid to understanding the discussion that follows, the meaning of some specific terms applying to the specification and to the claims are explained.

Each "image", including as well an image resulting from scanning a hardcopy original as a so-called synthetic image—e.g. generated by a computer program—, is composed of a number of picture elements, shortly called "pixels or PEL's or dots".

A "contone or continuous tone image" is a representation of a spatial sampling of an original having a multiplicity of tone levels, and comprises information representative for optical density values—e.g. density, transmission, opacity—of said original. This information is laid down in digital data, either explicitly (previously) generated or implicitly generated (on the fly). A contone image may comprise a matrix of elements; each element—often called PEL—can take C different contone values, wherein the number C of possible values must be greater than two (C>2; e.g. C≈256).

In the present application, most of the described features are explicitly oriented towards a contone image, but they also explicitly or implicitly apply to a so-called "multiple tone or multitone image". By the term multitone image is meant an image with a rather moderate number of tone levels, comprising less tone levels than a contone image, but more than a halftone image.

As to the exposure of a pixel on a recording material, the present application makes a distinction between potentially "available radiation beams" and "effective (or effectively active) radiation beams". An available beam is only called "effective" if said beam is not shut off (e.g. by an electro-mechanical shutter, by an electro-optical valve, or by any other means) and really impinges on a thermo-sensitive recording material. Expressed more formally, effective radiation beams are radiation beams corresponding to an effective change in density on said thermographic recording material.

Thus really activated pixels or dots correspond, either after exposure as in direct thermography, either after development as in photo-thermography, to a density different from zero and will be called "effective dots".

An exposure according to data representative for tones of a contone image according to the present invention comprises as well an "imagewise" exposure (corresponding to data derived from scanning a hardcopy original) as an "information-wise" exposure (corresponding to data generated by a computer program).

Although in many publications often the wordings "scanning" and "recording" may be nearly synonyms, in other circumstances they really do differ in meaning.

The present specification uses the wording "scanning" when it refers (i) to capturing an input of data while reading an original, or (ii) to a linewise and pixelwise progressing movement (also called "sweeping"; cfr. laser beams 2 in FIG. 1, to be explained later on) of a reading or writing spot (in opposite to e.g. a simultaneous, parallel exposure of all active pixels by means of a CRT-screen, a LCD-screen, a LED-array). The wording "scanwise" is rather hardware-directed in referring to a linewise and pixelwise progressing movement. Scanwise thus differs definitely from rather software-directed wordings as "image-wise", or "information-wise". Dedicated examples comprise: "scanning an original, scanning exposure, scanning direction, scanwise exposing, fast-scan-speed, . . . ."

The present specification uses the wording "recording" when it refers to driving an output of data for writing (by heating) a recording material, intended for generating or producing an optically perceptible image. Dedicated examples comprise: "thermal recording process, recording material, recording layer, recording power, . . . ." Yet, it may be clear that a recording process may comprise a scanning exposure (with a so-called sweeping movement). Other examples of equivalent expressions comprise: "recording (or scanning) device, recording (or scanning) speeds, scan-line or exposure line, . . . ." In the present specification the term "recording" strictly does not refer, at least not exclusively, to capturing and/or to memorizing data.

The wordings "recording time per dot" or "working dot exposure time" or "dot dwell time" or "pixel-time", are understood as being equivalent.

This pixel-time ($t_p$) can be calculated by dividing the fast-scan-dimension of a dot (e.g. the diameter φ if the spot is circular, or an equivalent diameter φ if the spot is e.g. elliptic, rectangular, or square) by the fast-scan-speed ($v_f$).

$$\text{Hence, } t_p = \phi : v_f \quad [1]$$

Also following terms are meant to be synonyms: thermo-sensitive, or thermosensitive, or heat-sensitive; thermal recording or thermo-recording or thermal producing . . . .

From the background section of the present application, it may be understood that the general term "thermography" includes as well "direct-thermography" as "photo-thermography". As to the thermosensitive recording or imaging materials, the corresponding terms are more strictly specified by reading "thermographic recording material" (which refers to direct thermography) and "photo-thermographic recording material".

As still other important terms may appear in the following description, said terms will be explained at their first introduction.

(ii) Preferred Embodiments of Methods for Thermal Recording or Producing a Contone Image According to the Present Invention Imagewise exposure in accordance with the present invention proceeds by a scanwise exposure by means of e.g. a laser according to the image data preferably directly on the thermo-sensitive recording material. Attention is given now to several aspects of an exposure according to the present invention.

It is highly preferred in connection with the present invention to use a laser emitting in the infrared and/or near-infrared, i.e. emitting in the wavelength range 700–1500 nm. Suitable lasers include a Nd-YAG-laser (neodymium-yttrium-aluminium-garnet; 1064 nm) or a Nd-YLF laser (neodymium-yttrium-lanthanum-fluoride; 1053 nm). Typical suitable laser diodes emit e.g. at 830 nm or at 860–870 nm.

A preferred imaging apparatus suitable for image-wise scanning exposure in accordance with the present invention preferably includes a laser output that can be provided directly to the thermo-sensitive recording material surface via lenses or other beam-guiding components, or transmitted to the surface of a recording material from a remotely sited laser using a fibre-optic cable. A controller and associated positioning hardware maintains the laser beams at a precise orientation with respect to the surface of the recording material, scans the output over the surface, and activates the laser beams at positions adjacent selected points of the recording material. The controller responds to incoming image signals corresponding to the original document and/or picture which is copied onto the recording material to produce a precise negative or positive image of that original.

Before turning attention to detailed sketches and corresponding explanation of possible configurations of the radiation beams in a method according to the present invention (cfr. FIGS. 5A to 5E, 6A to 6F, 7A to 7G, and 8A to 8G, to be discussed later on), some introductory clarification about specific wordings and their meanings will be disclosed with reference to FIGS. 2A to 2C, 3A to 3D, and 4A and 4B.

Figure 2A:
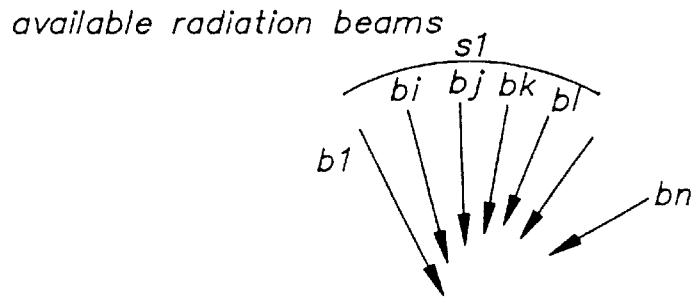
FIGS. 2A to 2C indicate a set of available radiation beams impinging on a dot on a scanline.

FIG. 2A indicates a set or plurality s1 comprising several available radiation beams b (ranging from b1, over bi-,bj-bk-b1 . . . to bn).

Figure 2B:
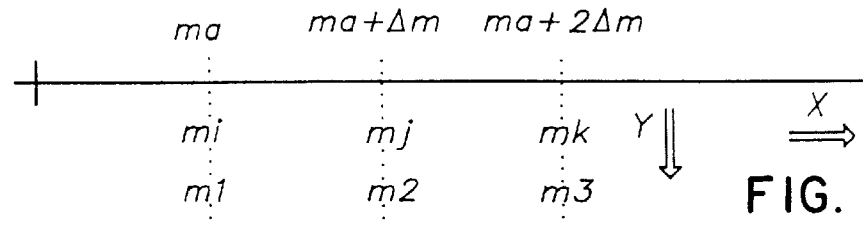

FIG. 2B indicates an arbitrary scanline 1a, comprising consecutive dots m; for example ma, ma+Δm, ma+2Δm; or mi, mj, mk; or simply m1, m2, m3 . . . . Symbol X indicates the fast-scan or main-scan direction; symbol Y indicates the slow-scan or sub-scan direction (cfr. also FIG. 4A).

Figure 2C:
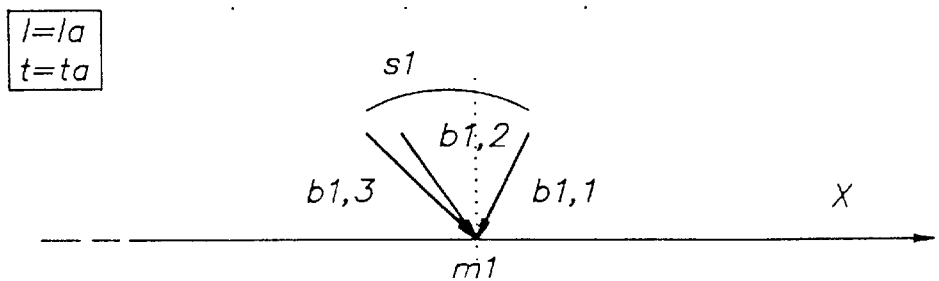

FIG. 2C indicates a set s1 comprising available radiation beams b1,1–b1,2 and b1,3 impinging at moment ta on a dot m1 on scanline 1a.

Whereas former drawings FIGS. 2A to 2C dealt with potentially "available radiation beams" (which are called "active or effective" when really impinging on the thermo-sensitive recording material), following drawings deal solely with "effective radiation beams." The thus really activated dots correspond to a density different from zero and will be called "effective dots".

FIGS. 3A to 3D indicate several different situations of a set comprising effective radiation beams impinging on neighbouring (or adjacent) dots on a scanline 1a. Contrary to FIGS. 5A to 5E, 6A to 6F, 7A to 7G, and 8A to 8G (to be explained later on), these FIGS. 3A to 3D have no time relation, they merely represent different possible situations.

Figure 3A:
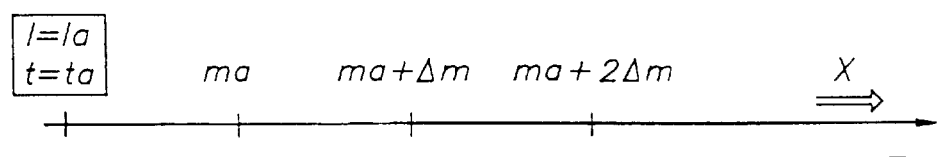
FIGS. 3A to 3D indicate a set of effective (or active) radiation beams impinging on neighbouring effective dots on a scanline 1$a$.

FIG. 3A indicates an arbitrary scanline 1a, comprising consecutive dots ma, ma+Δm, ma+2Δm . . . .

Figure 3B:
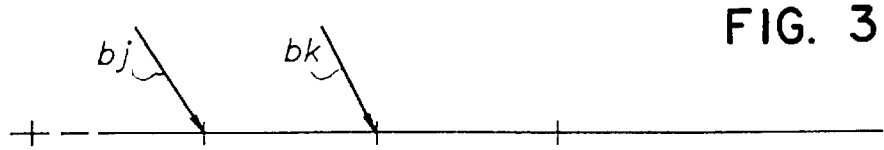

FIG. 3B indicates at a moment in time (ta) during exposure a set s comprising an effective radiation beam bj impinging on a dot ma on scanline 1a and an effective radiation beam bk impinging on an immediate neighbouring dot (ma+Δa) on same scanline 1a.

Figure 3C:
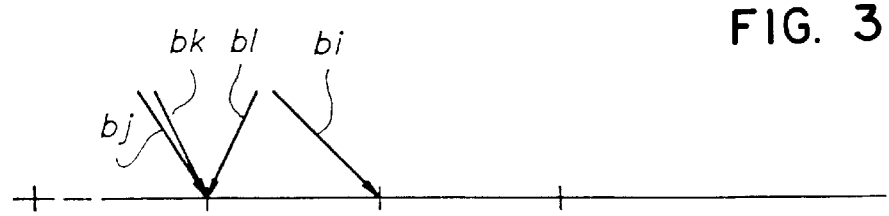

FIG. 3C indicates at a moment in time (ta) a set s comprising effective radiation beams bj–b1 impinging on a dot ma on scanline 1a and an effective radiation beam bi impinging on an immediate neighbouring dot (ma+Δa) on same scanline 1a.

Figure 3D:
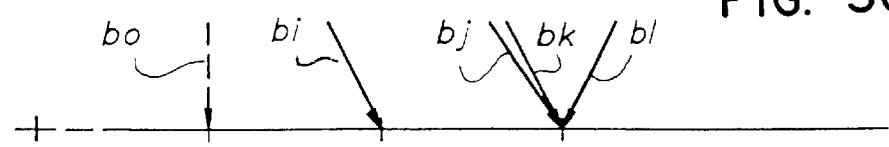

FIG. 3D indicates at a moment in time (ta) a set s comprising no effective radiation beams (didactically indicated by b0 and intentionally drawn with interrupted line-pieces) impinging on a dot ma on scanline 1a, an effective radiation beam bi impinging on an immediate neighbouring dot (ma+Δa) on same scanline 1a and effective radiation beams bj–b1 impinging on a further neighbouring dot (ma+2Δm) on same scanline 1a.

Figure 4A:
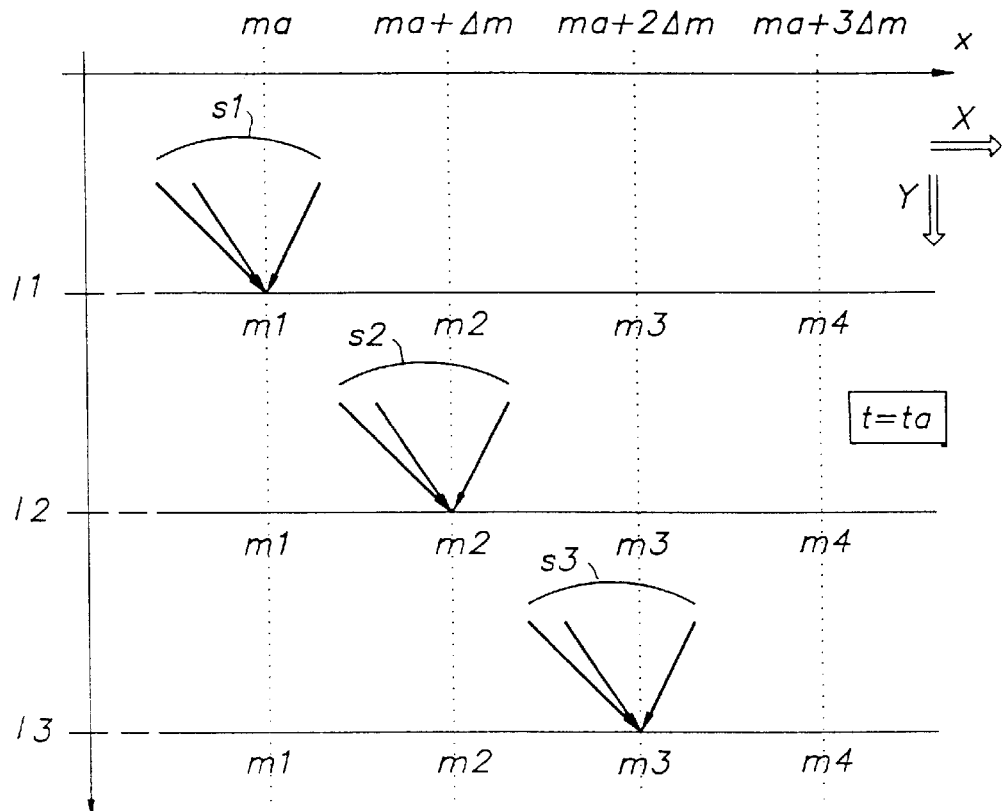
FIGS. 4A and 4B illustrate three sets of available radiation beams, each set impinging on a different dot or on a same dot of different scanlines.

FIG. 4A illustrates a recording according to the present invention using at a moment in time (ta) at least two sets, e.g. three sets (s1–s3) of available radiation beams, each set impinging on a different dot (respectively m1 to m3) of different scanlines (11 to 13). In relation to FIG. 4A it may be evident that consecutive sets do not need to impinge in a strictly consecutive order on consecutive dots. For example, a recording wherein at a moment ta a set s1 impinges on dot (ma+2Δm), wherein set s2 impinges on dot ma and wherein set s3 impinges on dot (ma+Δm) also is included within the scope of protection sought for by the present application.

Figure 4B:
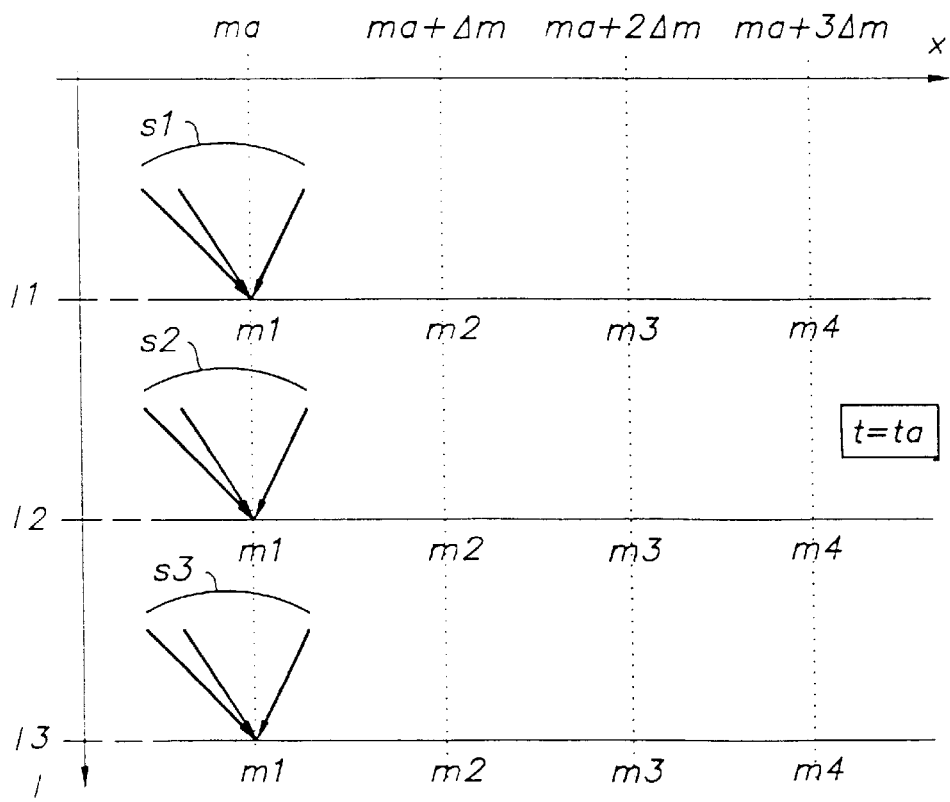
Figure 9:
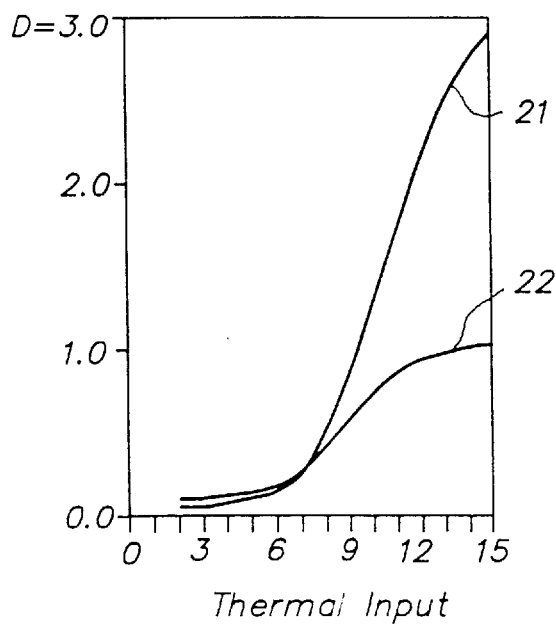
FIG. 9 illustrates a density curve of two thermographic recording materials according to the prior art.
Figure 10:
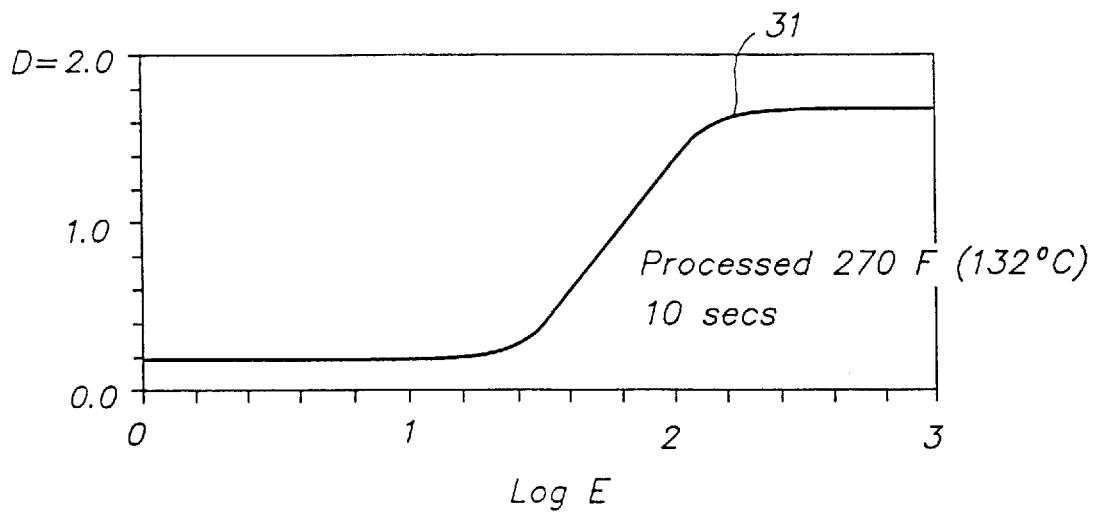
FIG. 10 illustrates a sensitometry curve of a photo-thermographic material according to the prior art.

FIG. 4B illustrates a recording according to the present invention using at a moment in time (ta) at least two sets, e.g. three sets (s1–s3) of available radiation beams, each set impinging on a same dot (m1) of different scanlines (11 to 13). Or expressed more extensively, each set of available radiation beams impinges on dots (e.g. m1 on 11, m1 on 12, m1 on 13) having a same position (ma) along the axis (X) of different scanlines (11 to 13).

FIGS. 5A to 5E, 6A to 6F, 7A to 7G, and 8A to 8G illustrate for some neighbouring dots on a same scanline the consecutive impingement of a set of radiation beams according to the present invention, corresponding intensity (or energy) distribution curves, and corresponding temperature evolutions in the thermo-sensitive recording materials.

Before studying FIGS. 5A to 5E, 6A to 6F, 7A to 7G, and 8A to 8G, one has to keep in mind that, for sake of clarity and simplicity, two premises were taken explicitly. However, these simplifications are not intended to restrict the conceptual scope of protection for the instant application.

First, at every moment in time (ta, ta+Δt, ta+2Δt . . . ) and at every dot (ma, ma+Δm, ma+2Δm . . . ) spot-sizes of individual radiation beams are thought to be equal.

Hence, $\phi(bi)=\phi(bj)=\phi(bk)=\phi(b1)$. [2]

Second, at every moment in time (ta, ta+Δt, ta+2Δt . . . ) and at every dot (ma, ma+Δm, ma+2Δm . . . ) intensities of individual radiation beams are thought to be equal in FIGS. 5A to 5E and 6A to 6F. This can be expressed symbolically by:

$I(bi)=I(bj)=I(bk)=I(b1)$ [3]

For FIGS. 7A to 7G (to be explained further on), the following is true:

$I(b'i)=I(bi, ma, ta+\Delta t)<I(bi, ma)=I(bj)=I(bk)=I(b1)$ [4]

For FIGS. 8A to 8G (also to be explained further on), analogue equations might be derived, reflecting that an intensity modulation of the radiation beams (bi, b'i, b"i; . . . b1, b'1, b"1) takes place.

By consequence of both explicit premises, in case of FIGS. 5A to 5E and 6A to 6F, even a third premise is implicitly incorporated. This premise states that, for every individual radiation beam, no intensity modulation nor area modulation or spotsize modulation takes place.

Hence, $\phi(bi; ta)=\phi(bi; ta+\Delta t)= \ldots$ [5]

and $I(bi; ta)=I(bi; ta+\Delta t)= \ldots$ [6]

With reference to FIGS. 5A to 5E, now a method according to the present invention will be explained in more depth. In FIGS. 5A and 5E is illustrated how, in order to attain a recorded image, at time ta, in dot ma on line 1a, three laser beams bj–b1 impinge on a dot ma with an energy to heat the recording material from a steady-state temperature equal to the temperature of the ambient (abbreviated on the temperature-scale in the drawing as "amb") to a temperature T lower than a conversion temperature Tt; so, the thermo-sensitive recording material does not produce a density change at this moment and at this place (dot). After some time Δt (see FIGS. 5B, 5D, and 5E), another laser beam bi reaches the same dot ma and heats the thermo-sensitive recording material (whose temperature had dropped in the meantime) up to a temperature substantially higher than the aforementioned conversion temperature Tt. In this situation, now an effective density change will be perceptible on the recording material.

As an example, but definitely non restrictive, after a second time-span 2Δt, no further laser beams impinge on same dot ma (see FIGS. 5C and 5E).

The incremental time difference ("period") Δt is defined by $(\Delta m : v_f)$ wherein Δm is the distance between two successive dots on the recording material and $v_f$ is the scan-speed of the radiation beams in the fast-scan or main-scan direction (X). Hence, $\Delta t = \Delta m : v_f$ [7]

So, in order to reproduce an effective dot, the temperature of the recording material may augment gradually within the available pixel-time. Then it is supposed, in relation to formulae [1, 7], that the incremental time period is larger than the pixel-time:

$t_p \leq \Delta t$ [8]

With reference to FIGS. 6A to 6F, at dot ma, the situations illustrated by FIGS. 6A, 6B and 6E approach those illustrated by (the already described) FIGS. 5A, 5B and 5E very nearly, so that here no further explanation has to be recapitulated. As to dot (ma+Δm), now another situation of a method according to the present invention, will be explained in great depth. In FIGS. 6B and 6F is illustrated how, at time (ta+Δt), in dot (ma+Δm) on line 1a, two laser beams bj and b1 (as available radiation beam bk is not active at this moment) impinge on said dot with an energy to heat the recording material to a temperature lower than a conversion temperature Tt; so, the thermo-sensitive recording material does not produce an effective change in density. After some additional time Δt, referring to moment (ta+2Δt)—(see FIGS. 6C and 6F)—, a supplemental laser beam bi reaches the same dot (ma+Δm) and heats the thermo-sensitive recording material (whose temperature had dropped in the meantime) up to a temperature still being substantially lower than the aforementioned conversion temperature Tt. So, although as well in FIG. 6E as in FIG. 6F the temperature of the recording material augments gradually within the available pixel-time, in dot ma an effective change in density will be perceived (cfr. FIG. 6E), whereas in neighbouring dot (ma+Δm) no density change will be perceived (cfr. FIG. 6F).

It is self-speaking that for further moments in time (as e.g. ta+3Δt) and for further dots (as e.g. ma+2Δm) a same reasoning could be developed.

Apart from the indicated premises, FIGS. 5A to 5E and 6A to 6F (and also next FIGS. 7A to 7G and 8A to 8G) illustrate a method according to the present invention, wherein at least a number n of effective beams (b1 to bn) within a set (s) impinging on a particular dot is varied.

Concerning FIGS. 7A to 7G and 8A to 8G, a typical differentiation illustrates a further preferred embodiment of a method according to the present invention. In former FIGS. 6A to 6E the intensities of the individual radiation beams were all equal at every moment in time, illustrating a method wherein only the number n of effective beams (b1 to bn) within a set (s) impinging on a particular dot is varied. In actual FIGS. 7A to 7G and 8A to 8G the intensities of the individual radiation beams are not equal at different moments in time.

In order to keep the drawings of FIGS. 7A to 7G still as clear as possible, in dot ma on scanline 1a, all effective radiation beams (bi–b1) have a same and constant intensity, which may be expressed mathematically by [I(bi)=I(bj)=I (bk)=I(b1); cfr. formula 3]. By doing so, the resulting temperature evolution in FIG. 7F is identical to that of a former embodiment illustrated in FIGS. 5E or 6E.

Yet, in dot (ma+Δm) on scanline 1a, all effective radiation beams except bi still have a same intensity, more particularly the intensity they have at every other moment in time (here ta+Δt; or ta+2Δt), but the intensity of bi is different (e.g. lower) in dot ma versus dot ma+Δa (cfr. formula 4). As a consequence, the resulting temperature evolution in FIG. 7G does not result in an effective change in density.

In another embodiment (illustrated in FIGS. 8A to 8G) of a method according to the present invention, all effective radiation beams have an intensity which varies over time. For sake of simplicity, said effective radiation beams are illustrated as having a same intensity if perceived at a same moment in time. So, e.g. FIG. 8B illustrates that at moment (ta+Δt) the intensities I(b'i)=I(b'j)=I(b'k)=I(b'1). That's why, the resulting temperature evolution in FIG. 8F resembles very well to FIGS. 7F and 6E.

But, said effective radiation beams all have another intensity if perceived at another moment in time. So, e.g. FIG. 8C illustrates that at moment (ta+Δt) the intensities I(b"i)=I(b"j) =I(b"k)=I(b"1)<I(b'i)=I(b'j)=I(b'k)=I(b'1). That's why, the resulting temperature evolution in FIG. 8F does not result in an effective change in density.

For sake of good understanding, it is clear for people skilled in the art, that also an embodiment of a method wherein at a moment in time the intensity of the individual radiation beams should be different, is also included (but not illustrated separately because of redundancy) within the instant invention.

The present application thus seeks protection as well for a method wherein at least one of said radiation beams is unmodulated, as well as for a method, wherein an instant intensity of at least one of said radiation beams is modulated.

Now, in a first "thermographic" embodiment according to the present invention, a method for thermal recording or producing of a contone image, comprises the steps of imagewise and scanwise exposing said thermographic recording material with a set (s) of radiation beams (b), characterised in that at any given moment (t) during said exposure at least two radiation beams of said set (s) of radiation beams impinge on different dots (m) of a scanline (l) on said thermographic recording material, so that by completion of the exposure step each effective dot (that is a dot corresponding to a density different to zero) of said scanline has been impinged by all effective radiation beams (which are radiation beams corresponding to an effective change in density on the recording material) of said set.

In another embodiment according to the present invention, by completion of the exposure step each effective dot of said scanline has been impinged by each of said at least two radiation beams of said set.

In still another embodiment according to the present invention, by completion of the exposure step each effective dot of said scanline has been impinged by all radiation beams of said set.

In a further preferred embodiment of a method according to the present invention, at least one of said radiation beams is modulated in intensity or power.

In a "photo-thermographic" embodiment according to the present invention, a method for thermal recording or producing a contone image, comprises the steps of:

(1) imagewise exposing said photo-thermographic recording material;

(2) scanwise developing said exposed photo-thermographic recording material with a set (s) of radiation beams (b), characterised in that at any given moment (t) during said development at least two radiation beams of said set (s) of radiation beams impinge on different dots (m) of a scanline (l) on said photo-thermographic recording material, so that by completion of the development step each dot of said scanline has been impinged by all effective radiation beams of said set. It may be underscored that said development is carried out so that a uniform heating of the exposed recording material is attained (e.g. no image-wise heating during development).

In a further preferred thermographic or photo-thermographic embodiment said imagewise and scanwise exposing or said scanwise developing is carried out on a recording material being positioned in a predetermined position relative to an exposure area or to a developing area.

In an alternatively preferred thermographic or photo-thermographic embodiment, said imagewise and scanwise exposing or said scanwise developing is carried out on a recording material being transported through an exposure area or through a developing area.

In a further preferred thermographic or photo-thermographic embodiment said set (s) of radiation beams (b) comprises a constant number of available radiation beams, wherein the number of effective radiation beams is varied according to a desired density on the thermal recording of the contone image.

In a direct thermographic application, said number of effective radiation beams is varied during the exposure step; such in order to obtain a desired image with a desired density. In a photo-thermographic embodiment, said number is varied after the exposure step, but before the development step; such in order to obtain a desired development temperature and a desired density.

In a further preferred thermographic or photo-thermographic embodiment, said at least two radiation beams of said set of radiation beams impinge on different, either immediately adjacent or non-immediately adjacent, neighbouring dots of a scanline on said thermographic recording material.

In a further preferred photo-thermographic embodiment, said developing is carried out by consecutively impinging radiation beams such that the exposed recording material achieves a uniform development temperature, in a time acceptable for the application concerned.

In an alternatively preferred thermographic or photo-thermographic embodiment, said radiation beams originate from an infrared laser source (comprising a gas-laser, a solid-state laser, a diode-laser . . . ) or even from light emitting diodes or a cathode-ray-tube; of course, sufficient power has to be available.

In a further preferred thermographic or photo-thermographic embodiment, at least one of said radiation beams is unmodulated.

In a further preferred thermographic or photo-thermographic embodiment, at least two of said radiation beams have a mutual different wavelength $\lambda$.

In a further preferred thermographic or photo-thermographic embodiment, at least two of said radiation beams have a different spot-size in the image plane $\Psi$.

In a further preferred thermographic or photo-thermographic embodiment, at least two of said radiation beams have a mutual different power P or a mutual different intensity I.

(iii) Preferred Embodiments for Thermo-Sensitive Recording Materials Suitable for Use in a Method According to the Present Invention In a thermographic embodiment of a method according to the present invention, said thermographic recording material comprises a support and a thermo-sensitive recording layer, comprising at least (i) a reducible organic metal salt, (ii) a polymeric binder, (iii) a reducing agent and (iv) an infra-red absorbing compound, said laser exposure inducing thermal reduction of said organic metal salt in the exposed areas by means of transformation of infra-red radiation into heat. Optionally, also a further protection layer, e.g. carried out as a top coating, may be comprised.

In a photo-thermographic embodiment of a method according to the present invention, said photo-thermographic recording material comprises a support and a thermo-sensitive recording layer (being photo-addressable and thermally developable), comprising at least (i) a substantially light-insensitive organic silver salt, (ii) a polymeric binder, (iii) an organic reducing agent for said substantially light-insensitive organic silver salt in thermal working relationship therewith and (iv) a photosensitive silver halide in catalytic association with said substantially light-insensitive organic silver salt, wherein said silver halide can be spectrally sensitized to the electromagnetic spectrum (for imagewise exposure).

In a further preferred embodiment the photo-thermographic recording material also comprises an infra-red absorbing compound (for scanwise development).

Optionally, also a further protection layer, e.g. carried out as a top coating, may be comprised within the photo-thermographic recording material.

(iv) Further Applicability of the Present Invention

Up to now, a lot of preferred embodiments according to the instant invention have been disclosed. Yet, still many others exist, as will become clear from the following paragraphs.

One particularly preferred embodiment relates to photo-thermography and incorporates a method for producing an image, preferably a contone image, comprising the step of scanwise exposing a photo-thermographic recording material with at least two radiation beams, characterised in that said at least two radiation beams move simultaneously over the recording material, wherein the first of said radiation beam carries out an image- or information-wise exposure (thus initiating a latent image) and wherein the second radiation beam heats the exposed recording material to a uniform development temperature (thus carrying out a thermal development, and thus creating a visible image).

The present invention of a method for thermal recording or producing a contone image, also may be applied in other fields with other types of thermo-sensitive recording materials which show a so-called "analogue or continuous-characteristic".

As a first example, so-called "laser induced dye transfer LIDT" may be indicated, which is a two-sheet system. In FIG. 1, a heat modulated ink carrier ribbon (or "donor element") 8 is displaced with a great precision in the area of incident laser beams 2 resulting from at least one laser source 1 by transporting rollers 9. A receiving material (or "acceptor element") 10 is displaced by a large transporting cylinder 11 in a predetermined, very small, spaced relationship relative to or in contact with the ink carrier ribbon 8 from which the ink is sublimed upon heating. Small transporting cylinders 12 which engage the large cylinder 11, insure a precise displacement of the receiving material 10 line by line. At the incidence line of the laser beams 2, the ink carrier ribbon 8 extends tangentially to the transporting cylinder 11.

In a further preferred embodiment (cfr. same FIG. 1), an additional source of infrared light 3 is located on one side of the laser beams 2. A thermal beam of the infrared light source passes through a lens 4 or is reflected from reflectors 6 and preheats the ink carrier ribbon 8 in the region of a laser beam defined line. Screens 6 are placed between the infrared light source 3 and laser beams 2, on one hand, and between the infrared source 3 and the transporting path of the ink carrier ribbon 8, on the other hand, to prevent heating of regions which are adjacent to the laser beam defined line region.

A basic method of producing a thermo-copy by a thermo-sublimation transfer comprises the steps of advancing a receiving material 10 into a sublimation area; bringing an ink carrier member 8 into the sublimation area opposite the receiving material in a predetermined relationship relative thereto, heating the ink carrier member in the sublimation area pixelwise for transferring an ink layer of a predetermined density from the ink carrier member to the receiving member; wherein said heating is carried out by a set of consecutive laser beams 2 linewise to provide for heating the ink carrier member pixelwise, and wherein (at least) the number of laserbeams is modulated in accordance with a predetermined density of the ink layer.

Herein, at a moment during said exposure at least two radiation beams of said set of radiation beams impinge on different neighbouring dots of a scanline on said imaging element, so that by completion of the exposure step each effective dot of said scanline has been impinged by all effective radiation beams of said set.

Another field of application refers to so-called Laser-induced-reductor-transfer LIRT and may be read in EP-A-94.200.794.9 (in the name of Agfa-Gevaert N.V.), which again refers to a two-sheet system (not illustrated by a separate drawing).

According to such an embodiment of the present invention, a method for thermal producing an image thus comprises the steps of:

(1) preparing a donor element by coating on a support one or more donor layers containing, a reducing agent, a radiation to heat converting compound, and optionally a polymeric binder;

(2) preparing an acceptor element by coating on a support an acceptor layer containing at least a reducible organic silver salt and a polymeric binder;

(3) bringing said donor element and said acceptor element in close contact with each other;

(4) imagewise and scanwise exposing the contacting elements with a set (s) of radiation beams (b), thus inducing the partial or complete transfer of said donor layer(s) to the acceptor element and/or diffusion of said reducing agent into the acceptor element;

(5) peeling apart the donor and acceptor elements;

(6) heating the acceptor element to an equal temperature suitable for fixing the recorded image, wherein at a moment during said exposure and/or during said heating at least two effective radiation beams of said set of radiation beams impinge on different neighbouring dots of a scanline on said imaging element, so that by completion of this step each effective dot of said scanline has been impinged by all effective radiation beams of said set.

Evidently, the recording material has to be spectrally sensitized to the electromagnetic spectrum corresponding to the imagewise exposure. And, if a scanwise development with infra-red radiation beams is carried out (in opposite to a uniform heating of the recording material, e.g. by overall contact with a heated platen) the recording material also comprises an infra-red absorbing compound corresponding.

As to the scanwise exposure of the imaging elements, it may be repeated that the present invention is not restricted to a strictly consecutive impinging of radiation beams on immediate neighbouring microdots on a same scanline. For example, it has already been indicated, with former reference to FIGS. 7A to 7G, 8A to 8G, 9, and 10, that optionally also non-immediate neighbouring microdots, also called further neighbouring microdots, might be exposed successively. In the future, as the attainable recording speeds may increase considerably, the distance between successive impingements of radiation beams also may enlarge.

However, an extremis embodied by a hypothetical sequence of radiation beams impinging totally and unlimited at random, has to be excluded. Indeed, a time interval between an impingement of two radiation beams on a same microdot of a scanline always has to be short enough in order to prevent a substantial cooling of an image forming layer at said microdot. A time interval between two consecutive recordings (or scannings) of the same microdot has to be shorter than a cooling time of the imaging element resulting from thermal diffusion or thermal inertia of the imaging element. Otherwise no sufficient accumulation of heat would occur.

A method for thermal imaging according to the present invention can be used for both the production of transparencies and reflection type prints. In the hard copy field generally recording materials on an opaque base (mostly white) are used. In the medical diagnostic field generally transparencies (mostly on a colourless or on a blue or green base, commonly black imaged) find wide application in inspection techniques operating with a light box.

In reference to medical diagnostics, more particularly, often a contone image is desired, which may be handled advantageously by a dedicated method according to the present invention.

Aside from the above-mentioned object of the present invention providing increased recording speeds without the occurrence of any unwanted side-reactions that impact the image quality of the printed images, still another advantage can be utilised. Here, reference is made to the so-called "intermittency effect". In general, it has been found that "a continuous exposure of a given irradiance and time did not produce the same photographic density as a second, equal-energy exposure, given in a number of discrete increments of the same irradiance . . . (and) that the intermittency effect was a manifestation of reciprocity failure . . . " (cit. "The theory of the photographic process", Th. James, ed. Mac Millan, New York, 4th edition, 1977, pp. 142–143).

While further modifications will become possible for those skilled in the art after receiving the teachings of the present disclosure, certain changes and modifications still can be made without departing from the spirit and scope of the invention as defined by the following claims.

We claim:

1. A method for thermal producing or recording a contone image, comprising the steps of imagewise and scanwise exposing a thermographic recording material with a set (s) of radiation beams (b), characterised in that at any given moment (t) during said exposure at least two radiation beams of said set (s) of radiation beams impinge on different dots (m) of a scanline (l) on said thermographic recording material, so that by completion of the exposure step each effective dot (meaning a dot corresponding to a density different to zero) of said scanline has been impinged by all effective radiation beams (which are radiation beams corresponding to an effective change in density on said thermographic recording material) of said set.

2. A method for thermal producing a contone image, comprising the steps of: (1) imagewise exposing a photo-thermographic recording material; (2) developing said exposed photo-thermographic recording material with a set (s) of radiation beams (b), characterised in that at any given moment (t) during said development at least two radiation beams of said set (s) of radiation beams impinge on different dots (m) of a scanline (l) on said photo-thermographic recording material, so that by completion of the development step each dot of said scanline has been impinged by all effective radiation beams of said set.

3. A method according to claim 1 or 2, wherein said set (s) of radiation beams (b) comprises a constant number of available radiation beams, wherein the number of effective radiation beams is varied according to a desired density on the thermal recording of the contone image.

4. A method according to claim 1 or 2, wherein said at least two radiation beams (bi,bj) of said set (s) of radiation beams impinge on different neighbouring dots (mi,mj) of a scanline (1a) on said thermographic recording material.

5. A method according to claim 1, wherein said thermographic recording material comprises a support and a thermo-sensitive recording layer, comprising (i) a reducible organic metal salt, (ii) a polymeric binder, (iii) a reducing agent and (iv) an infra-red absorbing compound, said laser exposure inducing thermal reduction of said organic metal salt in the exposed areas by means of transformation of infra-red radiation into heat.

6. A method according to claim 2, wherein said photo-thermographic recording material comprises a support and a thermo-sensitive recording layer, being photo-addressable and thermally developable, comprising (i) a substantially light-insensitive organic silver salt, (ii) a polymeric binder, (iii) an organic reducing agent for said substantially light-insensitive organic silver salt in thermal working relationship therewith and (iv) a photosensitive silver halide in catalytic association with said substantially light-insensitive organic silver salt, wherein said silver halide can be spectrally sensitized, preferably to the infrared region of the electromagnetic spectrum.

7. A method according to claim 2, wherein said developing is carried out by consecutively impinging radiation beams such that the exposed recording material achieves a uniform development temperature.

8. A method according to claim 1 or 2, wherein at least one of said radiation beams is unmodulated.

9. A method according to claim 1, wherein at least one of said radiation beams is modulated.

10. A method according to claim 1 or 2, wherein a time interval ($\Delta t$) between an impingement of one of said at least two radiation beams of said set and an impingement of another one of said at least two radiation beams of said set on a same dot of a scanline is short enough in order to prevent a substantial cooling of an image forming layer at said dot, and long enough in order to prevent unwanted side-reactions in said image forming layer at said dot.

* * * * *

UNITED STATES PATENT AND TRADEMARK OFFICE
CERTIFICATE OF CORRECTION

PATENT NO. : 5,804,355          Page 1 of 2

DATED : September 8, 1998

INVENTOR(S) : Bosschaerts et al.

It is certified that error appears in the above-identified patent and that said Letters Patent is hereby corrected as shown below:

Column 4, line 55, "C≈256" should read -- C=256 --;

Column 6, line 49, "bk-b1" should read -- bk-bl --;

Column 7, line 13, "bj–b1" should read -- bj–bl --;

Column 7, equation (2), "(b1)" should read -- (bl) --;

Column 8, equation (3), "(b1)" should read -- (bl) --;

Column 8, equation (4), "(b1)" should read -- (bl) --;

Column 8, line 10, "b1, b'1, b"1)" should read -- bl, b'l, b"l) --;

Column 8, line 24, "bj–b1" should read -- bj–bl --;

Column 8, line 64, "b1" should read -- bl --;

UNITED STATES PATENT AND TRADEMARK OFFICE
CERTIFICATE OF CORRECTION

PATENT NO. : 5,804,355

DATED : September 8, 1998

INVENTOR(S) : Bosschaerts et al.

It is certified that error appears in the above-identified patent and that said Letters Patent is hereby corrected as shown below:

Column 9, line 33, "(bi–b1)" should read -- (bi–bl) -- ;

Column 9, line 35, "(bk)=I(b1)," should read -- (bk)=I(bl), --;

Column 9, line 51, "(b′1)." should read -- (b′l) --;

Column 9, line 57, "(b″1)" should read -- (b″l) --; and "(b′1)" should read -- (b′l) --.

Signed and Sealed this

Twenty-first Day of December, 1999

*Attest:*

Q. TODD DICKINSON

*Attesting Officer*   Acting Commissioner of Patents and Trademarks